(12) United States Patent
Makishi

(10) Patent No.: US 6,562,143 B1
(45) Date of Patent: May 13, 2003

(54) METHOD FOR CLEANING HAZARDOUS WASTE FROM VACUUM CHAMBERS IN MOLECULAR BEAM EPITAXY PROCESSING

(75) Inventor: Todd K. Makishi, Harbor City, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 197 days.

(21) Appl. No.: 09/667,957

(22) Filed: Sep. 21, 2000

(51) Int. Cl.⁷ .............................. B08B 3/02; B08B 5/04
(52) U.S. Cl. ................... 134/21; 134/22.1; 134/22.18; 134/24
(58) Field of Search ..................... 134/21, 22.1, 22.18, 134/24

(56) References Cited

U.S. PATENT DOCUMENTS

| | | | | |
|---|---|---|---|---|
| 3,663,174 A | * | 5/1972 | Dany et al. | 23/223 |
| 3,902,860 A | * | 9/1975 | Akai et al. | 23/301 SP |
| 5,672,541 A | * | 9/1997 | Booske et al. | 437/160 |
| 6,030,458 A | * | 2/2000 | Colombo et al. | 118/719 |

* cited by examiner

Primary Examiner—Zeinab El-Arini
(74) Attorney, Agent, or Firm—Ronald M. Goldman

(57) ABSTRACT

Cleaning of MBE vacuum chambers of residue containing a volatile material, such as red phosphorus, is safely achieved by wetting the residue with de-ionized water (37) and depositing the residue in a water bath, formed by the water at the bottom of the chamber, to form a slurry. The slurry is vacuumed (1 & 30) from the chamber and collected (44) within the canister (3) of the vacuum cleaner. The water precludes ignition of the red phosphorus during cleaning of the chamber and during collection within the canister of the vacuum cleaner.

5 Claims, 2 Drawing Sheets

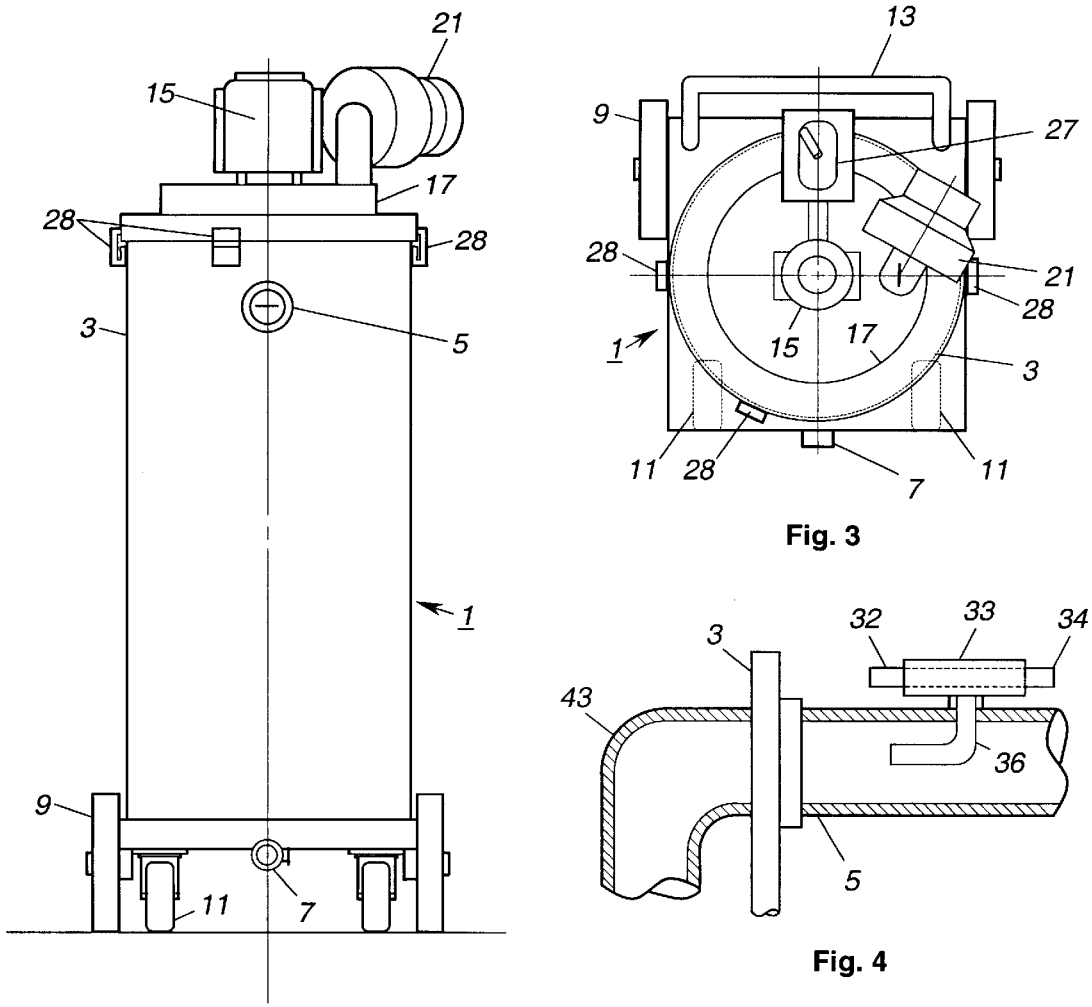

METHOD FOR CLEANING HAZARDOUS WASTE FROM VACUUM CHAMBERS IN MOLECULAR BEAM EPITAXY PROCESSING

FILED OF THE INVENTION

This invention relates to cleaning of hazardous waste formed in vacuum chambers of molecular beam epitaxy processing equipment during the process of growing layers of Indium Phosphide material on a substrate, and, more particularly, to a method and vacuum cleaning apparatus for removing hazardous residue from the vacuum chamber without endangering either the maintenance personnel or the environment.

BACKGROUND

The molecular beam epitaxy (EMBED) process has been accepted as a preferred fabrication process for the production of Indium Phosphide ("InP") type heterojunction bipolar transistors ("HBT") and high electron mobility transistors ("HEMT"). In that process selected group III and group V elements (of the periodic table of elements) are heated to vaporization temperatures in respective shuttered effusion cells inside of a vacuum chamber for deposit on a substrate of InP placed within that chamber. The elements that are vaporized at different times typically include Indium, Gallium, arsenic, silicon and phosphorous. As each element is needed in the fabrication process, a shutter covering the respective heated element, is opened, allowing the vapor of the element, metal or non-metal, to form a beam of molecules of the element that exits the associated effusion cell and coats the internal apparatus of the vacuum chamber. Some of that evaporated material deposits on the InP substrate to build-up epitaxial layers of the material on the substrate, which is the purpose of the process. By appropriate control of the effusion cell shutters, the desired layered structure that defines the transistor is ultimately produced. Typically, the MBE deposition process continues for long periods and, typically, takes between four and six months of continuous operation to complete a respective HBT or HEMT growth campaign. The remainder of the evaporated material during the processing, however, remains on the walls of the vacuum chamber, and constitutes the waste or, as otherwise termed, the residue of the MBE process. The present invention concerns safely cleaning up that waste.

Eventually with continued processing, the chemical elements within the effusion cells in the MBE vacuum chamber are depleted, and must be replenished. At that time the heat is turned off, the vacuum chamber is vented to the atmosphere, the chamber port is removed to allow full access to the internal apparatus. The inner walls of the chamber are covered with the residue of the processing, the portion of the material that deposited on the walls of the chamber. The residue on the chamber wall may comprise chunks or particulate of any and all of the materials vaporized during processing. The predominant ingredients of that residue are particulate arsenic and red phosphorous material.

Before restocking and reusing the vacuum chamber, the chamber must be cleaned of that residue. To do so, using a water-scraper maintenance personnel scrape the walls or use an abrasive tool to remove the residue. The material scraped off the chamber walls falls to the bottom of the chamber and to other regions of the chamber that are difficult to reach, where such debris collects and must be removed.

The volatile nature of the red phosphorus in that debris poses a problem in the cleaning procedure. In other MBE processing systems in which Arsenic is the material that is evaporated during processing, and the residue of the process contains essentially only Arsenic particulate that is scraped from the chamber walls, cleaning up of the Arsenic residue from the bottom of the chamber is quite simple. A HEPA vapor vacuum cleaner is used to vacuum up the particulate. The HEPA filters in the vacuum cleaner prevent arsenic particulate from escaping to the environment so that maintenance personnel are not exposed to a hazard. One known HEPA vapor vacuum cleaner is the Vapor Vac™ model vacuum cleaner marketed by Nilfisk of America. Such a convenient approach to cleaning the chamber is not possible when red phosphorus is involved.

Red phosphorus, a metal of an allotropic form referred to as P-2, has quite different chemical properties than arsenic, and different even from the white form of phosphorus (e.g. P-4 or white phosphorus). Red phosphorus is easily ignited by friction, and will burst into flame. Even when the flame is extinguished, the phosphorus may continue to smolder, posing a continuing danger. Not only posing a fire hazard, one of the products of combustion of the red phosphorus when ignited in air is phosphorus pentoxide, a very corrosive gas.

Due to the foregoing volatility and high risk of ignition of the red phosphorus, the described scraping procedure for cleaning poses risks for cleaning personnel, who must take special safety precautions, including wearing fire. resistant apparel and breathing apparatus in cleaning the chamber. Further, due to that volatility and high risk of ignition of the red phosphorus, a standard HEPA/Vapor vacuum cleaner is not recommended for use with red phosphorous material (and, when queried, the manufacturer advised against such use). Even vacuum cleaners advertised as "explosion proof", such as the EXP 1-75 vacuum cleaner manufactured by Nilfisk of America or the accessories from the SCV spray cleaner vacuum from that company, were, on advice of the manufacturer, said to be incapable of handling and were not designed to capture Red Phosphorus or other flammable metals. As an advantage, the present invention provides a way of safely cleaning the MBE vacuum chamber of residue containing red phosphorus or like volatile material.

Accordingly, a principal object of the invention is to improve the technique for cleaning MBE vacuum chambers.

A further object of the invention is to provide a system for safely vacuuming up particulate red phosphorus material or any other volatile flammable metal particulate having like combustion properties and reaction to that of Red Phosphorus.

And a still further object of the invention is to provide a method of safely removing hazardous residue that contains red phosphorus from the vacuum chamber of MBE processing equipment.

SUMMARY OF THE INVENTION

In accordance with the foregoing objects and advantages, the invention is characterized by maintaining the red phosphorus residue wetted with water during the cleaning of the vacuum chamber. A vacuum cleaner is used to extract the particulate scraped from the chamber walls, while, simultaneously, water is sprayed onto those walls. Particulate and water drops to the bottom of the chamber and with the residue forms a slurry that is drawn up by the negative pressure produced by the vacuum cleaner. The red phosphorus is maintained wet even after being drawn into the vacuum. As a additional aspect to the invention, the water is de-ionized water.

A vacuum cleaner in accordance with the invention includes a water spray carried on the vacuum hose nozzle for spraying water out while simultaneously vacuuming up the slurry of residue and water for deposit within a canister. A vacuum cleaner constructed in accordance with the invention further includes a flexible expandable (and contractible) hose internal to the canister of the vacuum cleaner. The flexible hose extends to the canister inlet while the other end of the hose, coupled to a float, is held above the level of any slurry drawn into the canister during vacuuming.

The foregoing and additional objects and advantages of the invention together with the structure characteristic thereof, which was only briefly summarized in the foregoing passages, will become more apparent to those skilled in the art upon reading the detailed description of a preferred embodiment of the invention, which follows in this specification, taken together with the illustrations thereof presented in the accompanying drawings.

BRIEF DESCRIPTION OF THE DRAWINGS

In the drawings:

FIG. 2 is another side view of the embodiment of FIG. 1 from the front side with the hose component omitted;

FIG. 3 illustrates the embodiment of FIG. 2 in a top plan view;

FIG. 4 is an enlarged view of a portion of the embodiment of FIG. 1 taken along the lines 4—4 in FIG. 1 to illustrate a particular component in greater detail; and FIG. 5 is an enlarged view of a another portion of the embodiment of FIG. 1 taken along the lines 5—5 in FIG. 1 to illustrate another component in greater detail.

DETAILED DESCRIPTION OF THE PREFERRED EMBODIMENTS

Figure 1:
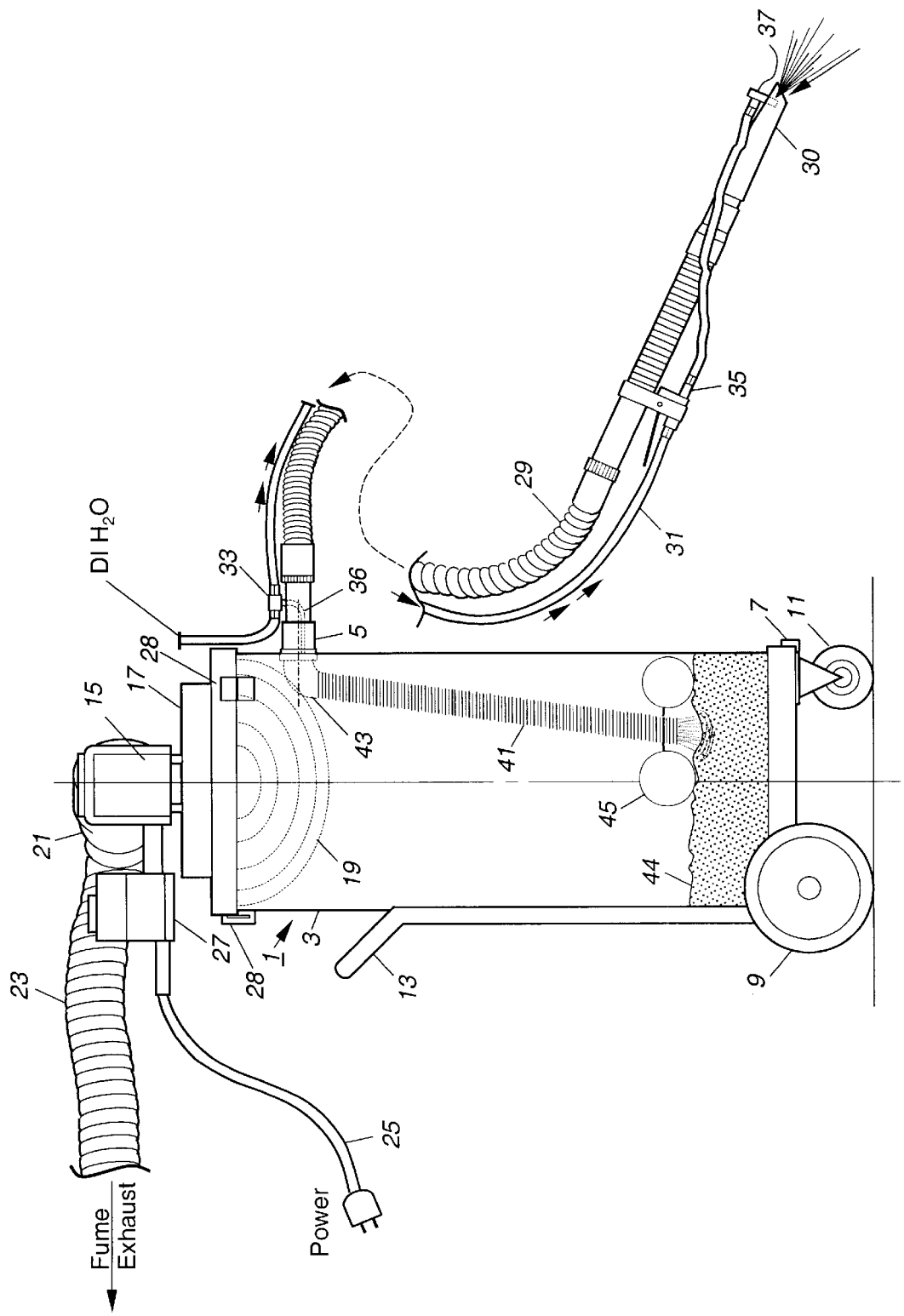
FIG. 1 is an embodiment of the vacuum cleaning apparatus as viewed from a side.

Reference is made to FIGS. 1 through 3, illustrating the vacuum cleaning apparatus 1 that is constructed in accordance with the invention in front, side and top views, respectively. Referring to FIG. 1, the vacuum cleaner includes a cylindrical metal canister 3. The canister is mounted integrally to a cart containing wheels 9 and 11, and handle 13 which allows the apparatus to be moved about easily and enhances the portability of the cleaning apparatus. The canister also contains an inlet 5 at an upper side of the canister and a drain outlet 7, more readily viewed in FIG. 2, on the lower side thereof. FIG. 2 illustrates another side of the vacuum cleaning apparatus and FIG. 3 illustrates the apparatus in top view. For clarity, certain components illustrated in the more detailed illustration of FIG. 1 are omitted from FIGS. 2 and 3, such as hose 29.

Returning to FIG. 1, an electric motor-vacuum pump assembly 15 is mounted atop a covering lid 17 to the canister. For convenience the side of the canister is illustrated in FIG. 1 as being transparent to permit inspection of the additional components to the apparatus located inside canister 3. Motor blower assembly 15 incorporates a high velocity blower, not separately illustrated, that opens to the under side of the lid inside canister 3. The lid is removable and attaches to the top end of the canister by latches 28 of conventional structure. When unlatched, lid 17, together with the motor assembly, may be lifted off the top of the canister to permit access to the internal parts and permit removal and cleaning of the mesh filter 19.

The electrical motor-blower 15 exhausts to an exhaust port 21, which connects, via a flexible hose 23, to a house exhaust system, not illustrated, in the facility or building using the equipment. Electrical power is supplied to motor 15 by power cord 25 and power (e.g. "on-off") switch 27. The underside of lid assembly 17 is covered by a stainless steel mesh 19. The mesh is pervious to gas, but is impervious to and captures any large size particles ingested within the canister during vacuum cleaning action.

In many respects, the foregoing structure incorporates much of the structure of the prior vacuum cleaning apparatus, such as the explosion proof vacuum cleaner of the Nilfisk of America company. Such prior vacuum cleaning apparatus may be modified in accordance with the teachings of this specification to incorporate the additional elements required by the present invention.

Continuing with FIG. 1, cleaning apparatus 1 further includes a flexible vacuum or pick-up hose 29, which contains a nozzle 30 at the free end, and a flexible fluid hose 31. A special "T" type connector 33, which serves as a distribution manifold for fluid, later herein more fully described in connection with FIG. 4, and manually operable fluid switch 35 are serially connected in the fluid conduit formed by fluid hose 31. An adapter 37, which contains a spray outlet, is attached to the outlet end of the fluid hose and is more fully described in connection with FIG. 5.

Fluid distribution manifold (e.g. "T"-connector) 33 is better illustrated in an enlarged view in FIG. 4, to which reference is made. The left and right hand inlet and outlet tubes, 32 and 34, to the connector are straight and connect to respective sections of fluid hose 31, joining those hose sections together. The depending tube 36 however bends through an angle of approximate ninety degrees, and, as installed on the inlet port 5, the depending tube extends into the inlet passage and the outlet thereof faces toward the canister.

Inlet port 5 contains (or, if modifying an existing vacuum cleaning apparatus, is modified to contain) a radially extending passage in which to mount distribution manifold 33 with the outlet tube 36 thereof positioned inside the cylindrical section of inlet port 5. The connector is mechanically sealed to the cylindrical section of the inlet port to maintain a leak-proof connection. The distribution manifold contains internal fluid passages interconnecting the inlet and all the outlets to the manifold so that fluid entering the inlet is distributed to the outllets.

Adapter 37 is better illustrated in FIG. 5 to which brief reference is made. The adapter contains a principal body portion that is cylindrical in shape. An inlet end 38 of the adapter attaches to the distal end of fluid hose 31, and the adapter defines an internal passage from that inlet to a spray outlet 40, located at the bottom end of the cylindrical portion of the adapter. The adapter is mounted within a small passage formed in nozzle 30 of the vacuum pick-up hose with the principal cylindrical portion of the adapter being oriented perpendicular to the fluid hose; and with the spray outlet 40 of the adapter being located inside nozzle 30, facing toward the open end of the nozzle of pick-up hose 31. Adapter 37 is attached to nozzle 30, suitably by mechanically clamping, not illustrated, to effectively secure the end of fluid hose 31 to the nozzle. The attachment permits fluid hose 31 to be moved jointly with movement of nozzle 30.

Reference is again made to FIG. 1. The side of inlet 5 on the inside of canister 3 contains a curve shaped conduit 43, called an elbow, which contains a ninety degree bend in direction between the conduit ends. The outlet end to that conduit is oriented downwardly inside the canister and connects to a flexible hose 41. The flexible hose contains accordion-like folds or corrugations. Hence the flexible hose may bend and expand and/or contract in length as later herein discussed in connection with the operation of the system.

A pair of floats 45, hollow air-filled metal spheres are connected to the outlet end of flexible hose 41. The floats provide a function similar to that of the hollow copper spheres used in the home toilet tank. The floats serve to ride on any fluid deposited in canister 3, such as indicated at 44, and holds the outlet end of hose 41 an appropriate distance above the level of that fluid. Preferably, the float is sufficient size to maintain the end of the hose about three inches above the fluid.

Since the vacuum cleaner 1 is intended to be both explosion proof and fire-proof, flexible hose 41 is formed of flexible fiberglass/silicon with very thin walls. Likewise, other components of the vacuum cleaning assembly canister are formed of the strongest metal where possible to permit any explosion to be contained and other components should be of metal or other material that is capable of withstanding high temperature.

For operation the cleaning apparatus 1 is wheeled up by maintenance personnel to the open vacuum chamber that is to be cleaned, the exhaust hose is connected to the exhaust system of the building or other facility where the MBE processing is situated, the inlet of the distribution manifold is connected to a source of de-ionized water that is under pressure (equivalent to that pressure of water found at the home water tap), and the power cord plugged into a convenient outlet. The hose nozzle 30 (and the water spray adapter 37 carried on the nozzle, is pointed at the inner walls or other locations of the vacuum chamber, hence, at the residue coating those walls, or where scraping has created clumps of Arsenic and Phosphorus and the water switch 35 is operated to allow water to flow through the hose.

Water is a convenient fluid to accomplish the purpose of the invention. The As water acts as a lubricant to reduce friction with the residue, precluding ignition of the residue by friction. Water is non-flammable, and suppresses combustion by cooling the combustible substance and in providing a bath for the substance, isolates the substance from large quantities of oxygen in the air. The water is non-reactive with the ingredients of the residue and the residue does not dissolve in water. De-ionized water is preferred for cleaning of the vacuum chamber in MBE processing. De-ionized water is free of those impurities, such as rust ($FeO_2$) and organic compounds, which, if introduced into the MBE vacuum chamber and remain following the cleaning, would contaminate MBE processing of the InP substrate.

Water is forced through hose 31 and is expressed out the sprayer 40 to wet the residue covered walls. Excess water deposits on the bottom of the chamber.

Even though the residue may be sufficiently wet, the water spray is continued as long as scraping continues. The maintenance technician may then scrape down the walls of the wet residue. Like a wet match, the friction of scraping will not cause any wet red phosphorus in the residue to ignite. The residue scraped off the wall and excess water drops to the bottom of the chamber. Together the two ingredients produce a slurry, a watery mixture of insoluble matter.

Once the scraping is completed, cleaning the slurry from the chamber bottom begins. Electrical power to the vacuum cleaner is switched on at switch 27, and electric motor 15 drives the blower to create a vacuum or reduced air pressure in the canister 3 and, through the pick-up hose 29, creates a drawing force at the end of nozzle 30. Concurrently, the water to sprayer 37 occurs when switch 35 is operated, allowing water to flow through hose 31, producing a spray of water to the front end of the nozzle 30. Both the drawing action of the vacuum and a spraying action of the water coexist. The water spray ensures that any residue that is drawn into the pick-up hose remains wet; and the pumping action of the vacuum motor is sufficient to pick up the slurry.

The slurry of particulate red phosphorus, arsenic and water is drawn through vacuum pick-up hose 29, into inlet 5, coupling 43, and through flexible hose 41, where the slurry is deposited into the bottom of canister 3. Any particulate that does not drop into the slurry is splashed against the mesh screen 19, which blocks the particulate from migrating into the high velocity blower assembly 15. Maintaining as much of the red phosphorus as possible in the water eliminates the danger of ignition, and, hence, fire. Further, should any gas reaction occur within canister 3, such as a reaction between the water vapor, the arsenic and the phosphorus, the gas automatically evolves a hydride. All such gases are exhausted through exhaust port 21 and exhaust hose 23 to the outside atmosphere where the gas dilutes and dissipates harmlessly.

Reference is again made to FIG. 4 and the adapter 33 located at inlet 5 of the canister in that figure. In drawing the slurry through hose 29, through inlet 5, and into the ninety degree coupling 43, the slurry impacts the bend in coupling 43. Some particulate might adhere to the wall of that conduit. During the spraying and vacuuming action, a portion of the water flowing through hose 31 from the water reservoir is sprayed out the outlet tube 36 from distribution manifold 33. That water is directed under pressure against the inner wall of the bend in connector 43 so that the water spray knocks off any particulate matter that may adhere to the connector at the bend. Should any particulate of Red Phosphorus be caught in the bend, and remain there after the cleaning apparatus has been put away after use, the wet residue could dry out and could become inadvertently be ignited on later handling the cleaning apparatus or react in air to create a toxic hydride gas. The sprayer at this location is configured to spray water in a full-cone pattern. The full-cone spraying action created by the water spray at the bend ensures that the conduit is cleaned out and does not retain any particulate of Red Phosphorus.

In one practical embodiment, the de-ionized water was pressurized at up to sixty pounds per square inch. The water was expressed from the sprayer 37 at about 0.8 to 1.0 gallons per minute. Sprayer 37 may be a forty-five degree fan-spray type nozzle, which allows a flow of about 0.8 gallon of water per minute with a head pressure of 60 psi. Alternatively the sprayer could be a fan sprayer which sprays water in a fan-like distribution, which typically allows a water flow of about one gallon per minute. Sprayer nozzles of the foregoing type are marketed by the BETE company.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. A method of removing Red Phosphorus residue from a vacuum chamber of an MBE apparatus used in formation of Indium Phosphide HBT's and HEMT's comprising the steps of:

wetting the Red Phosphorus residue in the vacuum chamber with a non-flammable liquid; and drawing the wet Red Phosphorus residue from the chamber.

2. The method of removing Red Phosphorus residue from a vacuum chamber of an MBE apparatus used in formation of Indium Phosphide HBT's and HEMT's as defined in claim 1, wherein said step of wetting the Red Phosphorus residue in the vacuum chamber further comprises the step of:

spraying said residue with de-ionized water.

3. The method of removing Red Phosphorus residue from a vacuum chamber of an MBE apparatus used in formation of Indium Phosphide HBT's and HEMT's as defined in claim 1, wherein said vacuum chamber includes walls and a bottom, and wherein said step of wetting the Red Phosphorus residue in the vacuum chamber further comprises the steps of:

spraying said Red Phosphorus residue with water to wet said Red Phosphorus residue to produce a water bath at the bottom of said vacuum chamber; and detaching said wet Red Phosphorus residue from the walls of said vacuum chamber to permit said wet Red Phosphorus residue to fall into said water bath, wherein said residue and said water bath produce a slurry; and wherein said step of drawing the wet Red Phosphorus from the chamber further comprises the step of vacuuming up said slurry.

4. The method of removing Red Phosphorus residue from a vacuum chamber of an MBE apparatus used in formation of Indium Phosphide HBT's and HEMT's as defined in claim 3, wherein said water comprises de-ionized water.

5. A method of cleaning a metal particulate from a chamber, said metal particulate being volatile and flammable, comprising the steps of:

wetting said metal particulate with a non-flammable liquid to form a liquid slurry, wherein said non-flammable liquid suppresses oxidation and heating of said metal particulate; and drawing said liquid slurry from said chamber and collecting said liquid slurry in a canister.

* * * * *